(12) United States Patent
Willcock

(10) Patent No.: US 11,886,538 B2
(45) Date of Patent: *Jan. 30, 2024

(54) HISTOGRAM CREATION PROCESS FOR MEMORY DEVICES

(71) Applicant: Lodestar Licensing Group, LLC, Evanston, IL (US)

(72) Inventor: Jeremiah James Willcock, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/091,002

(22) Filed: Dec. 29, 2022

(65) Prior Publication Data

US 2023/0134152 A1   May 4, 2023

Related U.S. Application Data

(60) Continuation of application No. 17/513,444, filed on Oct. 28, 2021, now Pat. No. 11,568,630, which is a division of application No. 15/167,649, filed on May 27, 2016, now Pat. No. 11,164,033.

(60) Provisional application No. 62/168,399, filed on May 29, 2015.

(51) Int. Cl.
| | | |
|---|---|---|
| *G06F 7/00* | (2006.01) | |
| *G06F 17/18* | (2006.01) | |
| *G06T 5/40* | (2006.01) | |
| *G11C 11/4096* | (2006.01) | |
| *G11C 11/4091* | (2006.01) | |
| *G11C 11/4093* | (2006.01) | |
| *G11C 11/4094* | (2006.01) | |
| *G06V 10/50* | (2022.01) | |
| *G06V 10/94* | (2022.01) | |

(52) U.S. Cl.
CPC ............... *G06F 17/18* (2013.01); *G06F 7/00* (2013.01); *G06T 5/40* (2013.01); *G06V 10/50* (2022.01); *G06V 10/955* (2022.01); *G11C 11/4091* (2013.01); *G11C 11/4093* (2013.01); *G11C 11/4094* (2013.01); *G11C 11/4096* (2013.01); *G11C 2207/2245* (2013.01)

(58) Field of Classification Search
CPC ... G06F 17/18; G06F 7/00; G06T 5/40; G06T 1/20; G06V 10/50; G06V 10/955; G11C 11/4091; G11C 11/4093; G11C 11/4094; G11C 11/4096; G11C 2207/2245
See application file for complete search history.

(56) References Cited

U.S. PATENT DOCUMENTS

| | | |
|---|---|---|
| 4,540,188 A | 9/1985 | Meloche et al. |
| 5,552,999 A | 9/1996 | Polgreen et al. |
| 6,272,498 B1 | 8/2001 | Muthukrishnan et al. |
| 6,587,966 B1 | 7/2003 | Chaiken et al. |
| 7,075,003 B2 | 7/2006 | Johnson et al. |

(Continued)

OTHER PUBLICATIONS

Medeiros et al.; "A Parallel Histogram-Based Particle Filter for Object Tracking on SIMD-based Smart Cameras"; In Computer Vision and Image Understanding; vol. 114; Issue 11; 2010; pp. 1264-1272.

*Primary Examiner* — Jay W. Radke
(74) *Attorney, Agent, or Firm* — Fletcher Yoder, P.C.

(57) ABSTRACT

A processor-in-memory device includes a memory array, a sense amplifier, and a processing unit that has an accumulator. The processing unit is configured to receive a set of data. The processing unit then uses the sense amplifier and the accumulator to generate a first histogram of the set of data.

20 Claims, 4 Drawing Sheets

(56) References Cited

U.S. PATENT DOCUMENTS

| | | | |
|---|---|---|---|
| 8,078,918 | B2 | 12/2011 | Diggs et al. |
| 8,964,496 | B2 | 2/2015 | Manning |
| 9,812,185 | B2 | 11/2017 | Fisch et al. |
| 10,042,608 | B2 | 8/2018 | Tiwari |
| 10,146,537 | B2 | 12/2018 | Tiwari |
| 11,164,033 | B2 | 11/2021 | Willcock |
| 11,568,630 | B2 * | 1/2023 | Willcock .................. G06T 5/40 |
| 2003/0196030 | A1 | 10/2003 | Elliott et al. |
| 2012/0250411 | A1 | 10/2012 | Abiko et al. |
| 2014/0036597 | A1 | 2/2014 | Nakayama |
| 2014/0250279 | A1 | 9/2014 | Manning |
| 2015/0120987 | A1 | 4/2015 | Wheeler |
| 2015/0357008 | A1 | 12/2015 | Manning et al. |
| 2016/0062692 | A1 | 3/2016 | Finkbeiner et al. |
| 2016/0098200 | A1 | 4/2016 | Guz et al. |

* cited by examiner

HISTOGRAM CREATION PROCESS FOR MEMORY DEVICES

CROSS REFERENCE TO RELATED APPLICATIONS

This application is a Continuation of U.S. application Ser. No. 17/513,444, entitled "Histogram Creation Process for Memory Devices," filed Oct. 28, 2021, which is a divisional of U.S. Non-Provisional patent application Ser. No. 15/167,649, entitled "Histogram Creation Process for Memory Devices," filed May 27, 2016, which issued as U.S. Pat. No. 11,164,033 on Nov. 2, 2021, which is a Non-Provisional Application claiming priority to U.S. Provisional Patent Application No. 62/168,399, entitled "Histogram Creation Process for Memory Devices," filed May 29, 2015, which is hereby incorporated by reference in its entirety for all purposes.

BACKGROUND

1. Field of the Invention

The present invention relates generally to memory devices, and more particularly to memory devices having internal processors.

2. Description of the Related Art

This section is intended to introduce the reader to various aspects of art that may be related to various aspects of embodiments of the present invention, which are described and/or claimed below. This discussion is believed to be helpful in providing the reader with background information to facilitate a better understanding of the various aspects of embodiments of the present invention. Accordingly, it should be understood that these statements are to be read in this light and not as admissions of prior art.

A typical processor-in-memory (PIM) device, also known as processing-in-memory, is a memory device with one or more processors embedded in the device. The memory device can refer to dynamic random access memory (DRAM) or static random access memory (SRAM). The embedded processor on a typical PIM device may contain at least an arithmetic logic unit (ALU) that is capable of executing arithmetic and logic operations on one or more operands. For example, the ALU may add, subtract, multiply, or divide one operand from another, and may perform logic operations such as AND, OR, XOR, and NOT on one or more operands. By placing the processor directly within the memory devices, the PIM device may experience reduced power consumption.

Histograms are quite useful as they reveal the frequencies of the data set. A histogram can represent, for example, the frequency at which a data point will fall into a particular category. Histograms are particularly useful for operations that do not rely on strict knowledge of the data, or in other words, operations that depend on the presence or frequency of a particular type of data point rather than the actual value of the data points. Computing devices, including PIMs, may use histograms for tasks such as comparison operations (e.g., does this data set contain at least one of a specific type of value; what is the most common type of element), metadata for a data set (e.g., a histogram detailing the intensity of the pixels for an image), and image processing. For instance, many algorithms for color quantization of bitmap images (e.g., clustering algorithms) may use a histogram of the image data to determine the mapping between the colors displayed in the original image and the color palette of the quantized image.

Currently, to create a histogram, the processor assigns a counter to each type of category of data; these counters are usually disposed within the processor or may be locations in a memory array assigned to the categories. The processor then reads each data value, determines which category it belongs in, and increments the appropriate counter. However, this method may consume a lot of resources, as the more categories there are, the more counters may be required. The method may also consume a lot of time, especially as the amount of data increases, as incrementing a counter may require a significant amount of computing time. Further, creating a histogram is a task that may have limited parallelism. While the data can be separated into batches, and the batches processed in parallel, the method is very precise, in that each data point is analyzed. However, this level of precision may not be necessary for all applications.

As such, it would be beneficial to determine a new process for creating a histogram that decreases the computing time of the process. In particular, it would be beneficial to take advantage of the cases in which a rough estimation of the data is sufficient, rather than a high level of precision. Further, it would also be beneficial to take advantage of the proximity between the processor and the memory array.

DETAILED DESCRIPTION OF SPECIFIC EMBODIMENTS

Figure 1:
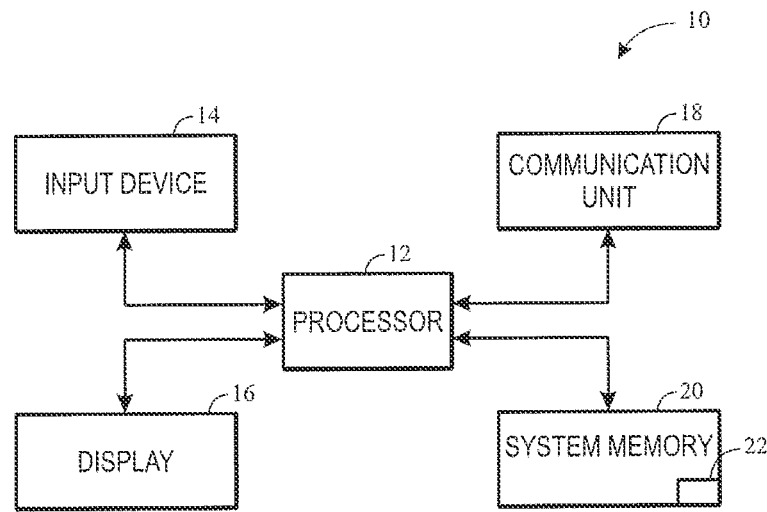
FIG. 1 is a block diagram of a processor-based system, in accordance with an embodiment of the present approach.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The term "sense amplifier" is intended to refer to both a single sense amplifier capable of storing several bits as well as a group (e.g., a row) of sense amplifiers, each of which is capable of storing a single bit. The term "accumulator" is intended to refer to both a single accumulator capable of storing several bits as well as a group (e.g., a row) of accumulators, each of which is capable of storing a single bit. The term "counter" is intended to refer to a digital logic device configured to store the number of times an event has occurred as well as a location in memory configured to store the number of times an event has occurred.

A processor-in-memory (PIM) device is a device that contains a memory array and one or more processors embedded within the device. In at least one embodiment, such an embedded processor may comprise sensing circuitry coupled to the memory array and controlled by a controller (e.g., an on-die controller, such as a state machine and/or sequencer). For example, such sensing circuity can comprise a sense amplifier and a compute component, such as an accumulator. In a number of embodiments, a compute component can comprise a number of transistors formed on pitch with the transistors of the sense amplifier and/or the memory cells of the array, which may conform to a particular feature size (e.g., 4F2, 6F2, etc.). As described further below, the compute component can, in conjunction with the sense amplifier, operate to perform various logical operations using data from array as input and store the result back to the array without transferring the data via a sense line address access (e.g., without firing a column decode signal such that data is transferred to circuitry external from the array and sensing circuitry via local I/O lines). One example of a schematic portion of the sensing circuitry and compute component coupled to the memory array will be described and illustrated with regard to FIG. 5 below.

According to at least one embodiment, a PIM device may execute to create a histogram for a data set. Histograms may be used for a variety of tasks, such as comparison operations, metadata for a particular data set, and error detection and correction. Typically, to create a histogram, a processor will assign each category to a counter, typically within the processor or a memory array, read each data value, determine the corresponding category, and increment the corresponding counter. However, this may be very time and resource consuming, as incrementing the counters within the processor can require a significant amount of computation time, which may be problematic as the size of the data set increases. Although other embodiments may assign locations in the memory array to the categories to act as de facto counters, the process still includes frequent updates to the values stored in the memory array. Further, the more categories that are included in the histogram, the more counters may be required. Additionally, the process is very precise, even though not all tasks that utilize histograms may need such precise results. However, not all tasks that utilize histograms require such a high level of precision. For example, a tonal distribution graph for an image may be designed based on approximated histograms of the intensity and color of the image pixels. That is, rather than creating a histogram and, subsequently, a tonal distribution graph for an image that records the intensity and color of each pixel, it may be preferable to approximate the histogram to reduce the computation time and resource usage for generating the histogram and the tonal distribution graph.

To, for example, reduce the time and resource consumption of creating histograms, present embodiments of a PIM device may use the disclosed histogram creation process, which will be described in further detail below. For example, a controller of the PIM device might utilize a memory array and sensing circuitry coupled to the memory array to approximate a histogram of batches of data in a data set. Once the histogram of a batch has been approximated, individual locations in the memory array that represent the categories of the histogram are incremented. Using a sense amplifier and an accumulator which can be located in close proximity to the memory array should utilize less computing time than incrementing a counter located within a processor or a memory array after analyzing each data point. As such, by reducing or eliminating the number of times a counter is incremented, computing time should be decreased. Further, within each batch, the counters need not be used at all; instead, a sense amplifier and accumulator, for instance, can be used to approximate the histogram, which also reduces the computing time. Additionally, the process may be tuned to various levels of precision. For example, the histogram creation process may be adjusted to provide a desired estimation of the histogram of the data set.

Turning to the figures, FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include memory devices manufactured in accordance with one or more embodiments of the present technique.

The system 10 may also include an input device 14 coupled to the processor 12. The input device 14 may include buttons, switches, a keyboard, a light pen, a mouse, a digitizer and stylus, and/or a voice recognition system, for instance. A display 16 may also be coupled to the processor 12. The input device 14 and/or the display 16 may each or both form a user interface. The display 16 may include an LCD, an SED display, a CRT display, a DLP display, a plasma display, an OLED display, LEDs, and/or an audio display, for example. Further, the system 10 may include a communication unit 18 that allows the processor 12 to communicate with devices external to the system 10. The communication unit 18 may establish a wired link (e.g., a wired telecommunication infrastructure or a local area network employing Ethernet) and/or a wireless link (e.g., a cellular network or an 802.11x Wi-Fi network) between the processor 12 and other devices.

The processor 12 generally controls the system 10 by processing software programs stored in the memory. The software programs may include an operating system, database software, drafting software, word processing software, and/or video, photo, or sound editing software, for example. The memory is operably coupled to the processor 12 to store and facilitate execution of instructions to implement various programs. For instance, the processor 12 may be coupled to the system memory 20, which may include dynamic random access memory (DRAM), and/or synchronous dynamic random access memory (SDRAM). The system memory 20 may include volatile memory, non-volatile memory, or a combination thereof. The system memory 20 is typically large so that it can store dynamically loaded applications and data.

Some embodiments of the present technique involve communication and coordination between the processor 12 and components of the system memory 20. For example, the processor 12 may include a general purpose processor, a central processing unit, a processor core, an ASIC, a memory controller, and/or an ALU, for example, capable of sending signals to, and receiving signals from, internal processors of memory devices in the system memory 20. Components of the system 10 involved in the communication and coordination between the processor 12 and the components of the system memory 20 may be generally referred to as a "memory system" 22, as illustrated in the block diagram of FIG. 2. In some embodiments, a memory system 22 may include a processor-in-memory (PIM) device 24, which may be part of the system memory 20 of the system 10. The memory system 22 may also include a memory processor 26, which may be in a system-on-a-chip (SOC) with a more general purpose processor to control the function of the memory system 22. The memory processor 26, which may also be an external memory controller, may communicate with and/or control certain components of the PIM device 24. It should be appreciated that the memory processor 26, which controls the function of the memory system 22, is distinct from the processor 12, which controls the function of the processor-based system 10. In alternative embodiments, the memory processor 26 may be integrated within an external processor, such as the processor 12, such that PIM 24 is controlled by the processor 12.

The memory system 22 may include components which have functions that are not limited to the communication between the memory processor 26 and the PIM device 24. For example, the memory processor 26 may control devices in addition to the PIM device 24. However, the memory processor 26, as explained with respect to the memory system 22, may refer to one function of the memory processor 26 which communicates with and/or controls certain components of the PIM device 24. Likewise, not all parts of the system memory 20 may be part of the memory system 22. The PIM device 24 may refer to components of the system memory 20 involved in the communication with the memory processor 26, in accordance with the present techniques.

The memory processor 26 and the PIM device 24 may be operably coupled by a standard memory interface 28 which may allow data transfer between the memory processor 26 and the PIM device 24, and may allow the memory processor 26 to send (e.g., transfer) commands to the PIM device 24. In one or more embodiments, the types of standard memory interface 28 may include DDR, DDR2, DDR3, LPDDR, or LPDDR2, for example. In other embodiments, the interface 28 may be a non-standard memory interface. Further, in some embodiments, an additional interface(s) may be configured to allow the transfer of data, and also commands (e.g., requests, grants, instructions, etc.), between the PIM device 24 and the memory processor 26. For example, the memory processor 26 and the PIM device 24 may also be operably coupled by a control interface 30, which may allow the transfer of commands between the memory processor 26 and the PIM device 24, including commands from the PIM device 24 to the memory processor 26.

The PIM device 24 may include an embedded processor 32 and a memory array 34. The memory array 34 may refer to any suitable form of storage, and may include, for example, a DRAM array, an SDRAM array, or an SRAM array. In the present embodiments, the memory array 34 may be coupled to one or more sense amplifiers 36, which are circuits that sense signals corresponding to data retrieved from the memory array 34 and amplify the signals, such as to logic levels that are recognizable by components outside of the memory array 34 (e.g., the memory processor 26). The memory processor 26 may have access to the memory array 34, and may be able to write data or instructions to be executed by the embedded processor 32. The embedded processor 32 may include one or more arithmetic logic units (ALUs) 38, one or more accumulators 40, and one or more counters 42. However, not all embodiments require an embedded processor 32 to include each of an ALU, accumulator and counter. For example, some embedded processors 32 might utilize an accumulator 40 as a compute component and not include an ALU or counter 42.

The embedded processor 32 may be capable of accessing the memory array 34, including retrieving information from, and storing information in the memory array 34. The process of retrieving and storing information between the embedded processor 32 and the memory array 34 may involve an internal controller, such as one comprising a sequencer 44 and buffer block 46. In other embodiments, the buffer block 46 may be omitted or provided in a different arrangement within the PIM device 24, such that the memory array is coupled directly to components of the embedded processor 32, such as the accumulators 40 or other compute components. The sequencer 44 may sequence the instructions sent by the memory processor 26 to the PIM device 24 and store the data retrieved from the memory array 34 in a memory component such as the buffer block 46. In other embodiments, the memory processor 26 may include the sequencer 44 or may include the functionality of the sequencer 44. In still other embodiments, the sequencer 44, as well as other types of control circuitry, may be included in lieu of the memory processor 26. Once the PIM device 24 has executed the instructions, the results may be stored in the buffer block 46 before they are written to the memory array 34. Further, as some instructions may require more than one clock cycle in the compute engine, intermediate results may also be stored in memory components in the PIM device 24, alternatively or additionally to using the memory array 34 to store intermediate results. For example, intermediate results may be stored in memory components such as the buffer block 46, other buffers, or registers (e.g., an accumulator 40) coupled to the embedded processor 32. In some embodiments, the buffer block 44 may include more than one layer of buffers. For example, the buffer block 46 may include a compute buffer, which may store operands, and an instruction buffer, which may store instructions. The buffer block 46 may also include additional buffers, such as a data buffer or a simple buffer, which may provide denser storage, and may store intermediate or final results of executed instructions.

Figure 2:
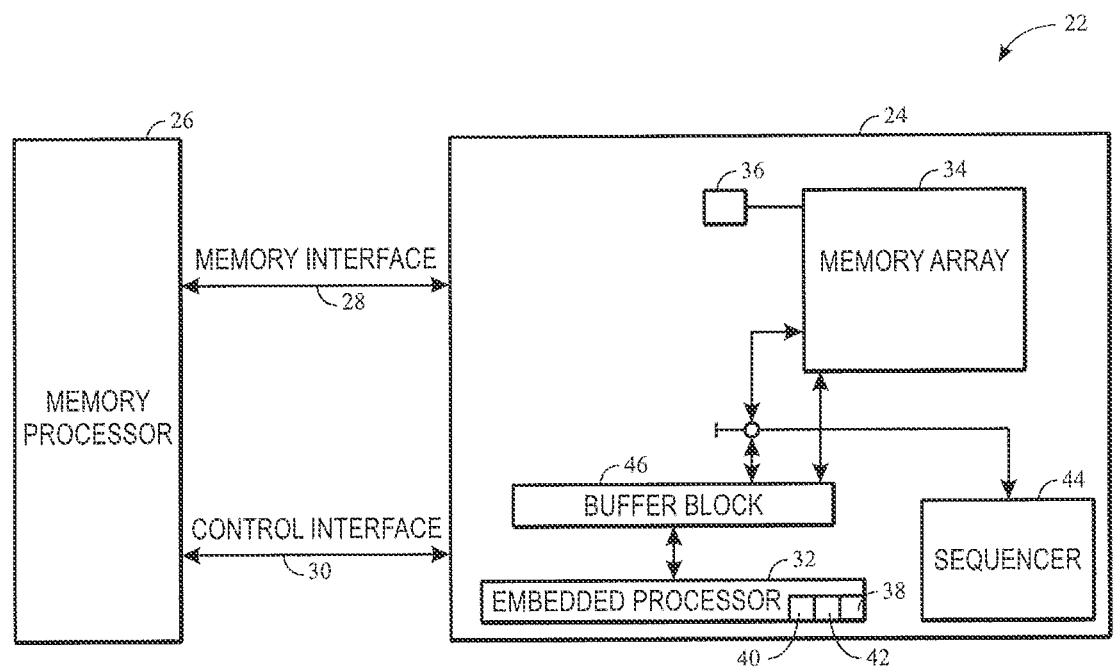
FIG. 2 is a block diagram of a memory system within the processor-based system of FIG. 1, in accordance with an embodiment of the present approach.
Figure 3:
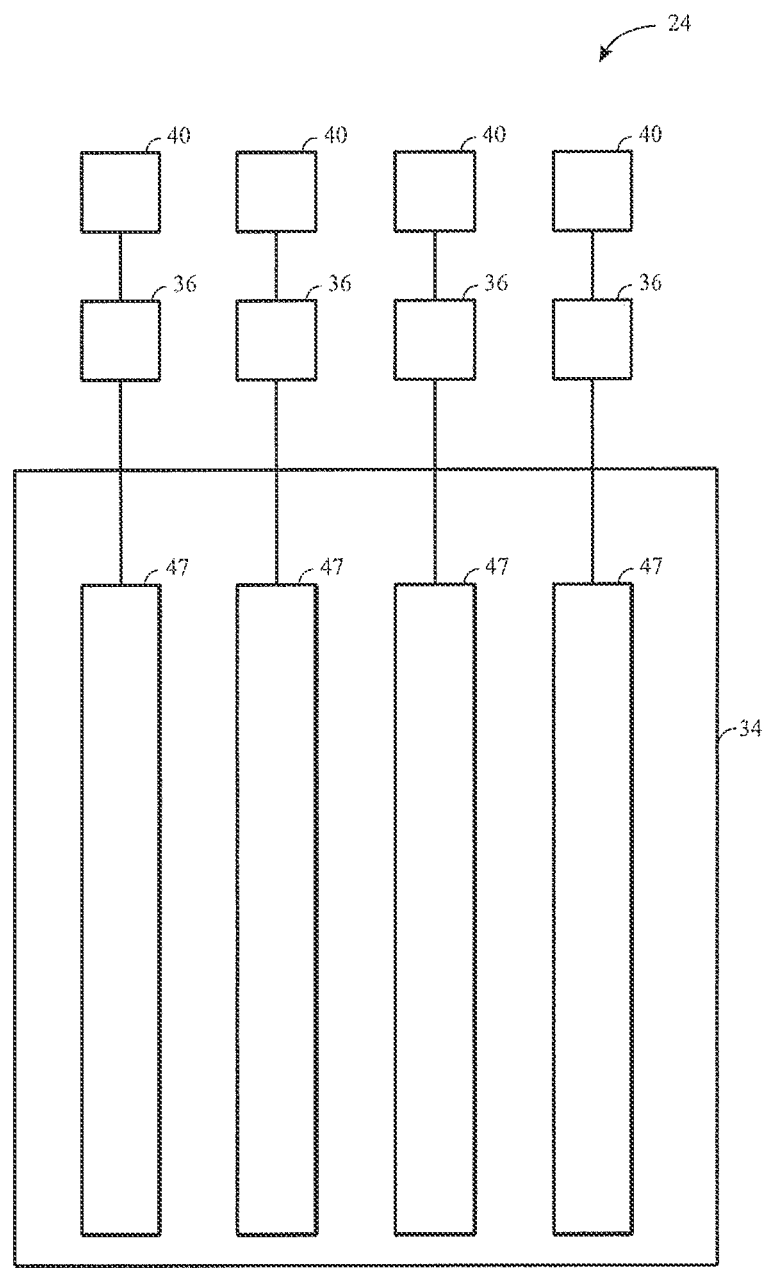
FIG. 3 is a block diagram illustrating a spatial arrangement of a processor-in-memory device in the memory system of FIG. 2, in accordance with an embodiment of the present approach.

As will be appreciated, the block diagram of FIG. 2 depicts communication and/or data flow between the various components of the memory system 22 and, specifically, the PIM device 24. Accordingly, the various components of the PIM device 24 (e.g., the embedded processor 32, etc.) and their subcomponents may be arranged in or across various device(s) differently in various embodiments. For example, as shown in FIG. 3, compute components, such as accumulators 40, may be closely coupled to the columns of the memory array 34 such that each compute component is in close proximity to the column(s) of the memory array 34 for which it is primarily used. In particular, FIG. 3 depicts an embodiment in which both a sense amplifier 36 and an accumulator 40 are directly coupled to each column 47 of the memory array 34. For such an embodiment, an ALU 38 may be omitted. As will be appreciated, in other embodiments, certain compute components, such as the accumulator 40, may instead be coupled to the rows of the memory array 34. Further, while a 1-to-1 correspondence between the sense amplifiers 36 and compute components, such as the accumulators 40, is illustrated, other ratios are envisioned, as well.

As mentioned above, the memory processor 26 may control the PIM device 24 to perform a variety of tasks relating to the data stored in the PIM device 24 as well as the system memory 20. One task that the memory processor 26 may utilize the PIM device 24 to complete is creating a histogram of a data set. Histograms can reveal the frequency of particular types of data within a data set, and as such may be useful for tasks that do not rely on strict knowledge of a data set. For example, histograms may be useful for operations that depend on the presence or frequency of a particular type of data point rather than the value of the data points themselves (e.g., what is the most common element type in the set). As such, histograms may be used for comparison operations, generating metadata for a data set (e.g., metadata for an image), and error detection and correction, among other things.

Conventionally, to create a histogram, a processor assigns each possible category of data to a respective counter. The processor then reads each data point in the set, determines the category of the data point, and increments the appropriate counter. However, incrementing a counter within the processor may take a significant amount of time, and since the counters are incremented for each data point, the computing time for creating a histogram may increase as the size of the data set increases. Further, in such systems, the processor may transfer the data values from the counters to a memory array during the process, further increasing the computing time. Although certain embodiments may assign locations in the memory array to the categories to act as de facto counters, the process still includes frequent updates to the values stored in the memory array.

To reduce the computing time of creating a histogram, a PIM device 24 may use a histogram creation process 48, which will be described and illustrated with reference to FIG. 4. The histogram creation process 48 may approximate the histogram of a data set, which may decrease the computing time. However, the histogram creation process 48 may still be adjusted to varying levels of precision as desired. Further, as will be discussed below, the histogram creation process 48 may utilize certain components in the PIM device 24 other than, or in addition to a dedicated counter 42, such that such counters 42 are used less frequently compared to the conventional process for creating a histogram, or not at all. This in turn enables the histogram creation process 48 to be used at varying levels of precision without significantly increasing the computing time.

Figure 4:
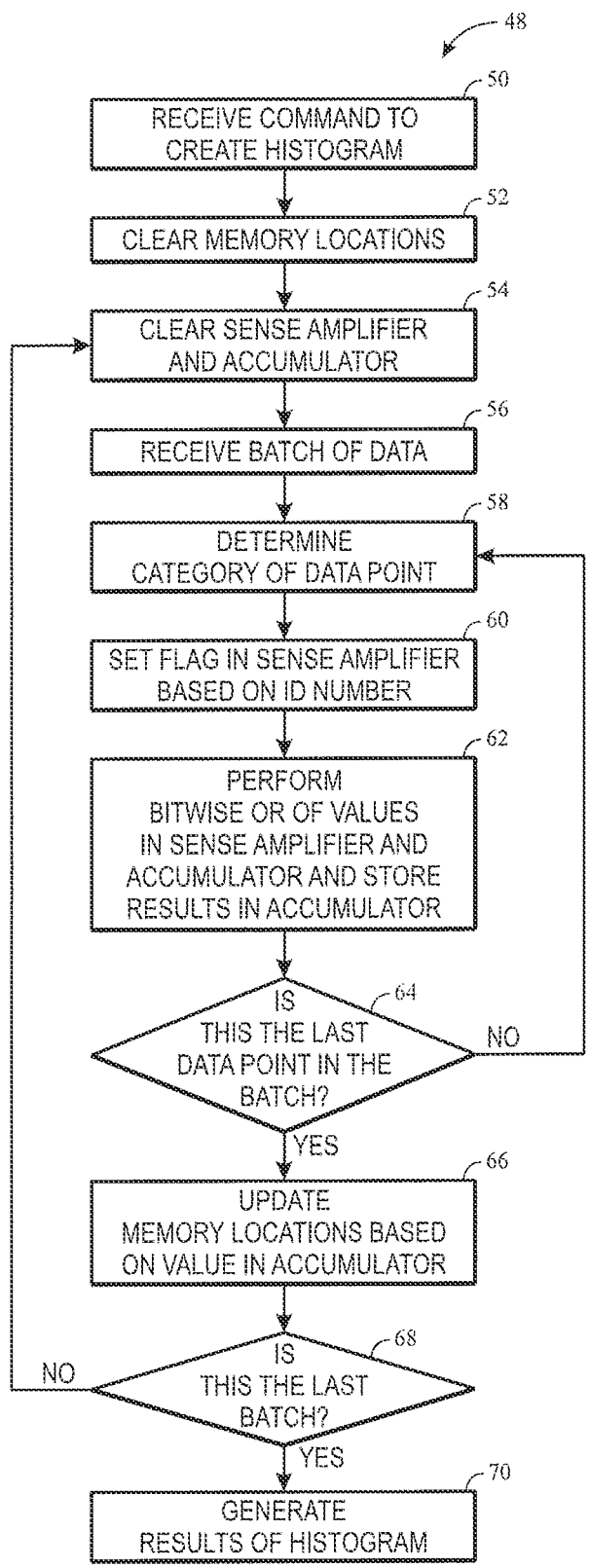
FIG. 4 is a flow chart illustrating a histogram creation process executed by a memory device within the memory system of FIG. 2, in accordance with an embodiment of the present approach.

FIG. 4 is a flowchart illustrating the histogram creation process 48. The histogram creation process 48 may be implemented as executable computer code stored in the system memory 20 and executed by the PIM device 24 at the direction of the memory processor 26. Although the histogram creation process 48 is described below in detail, the histogram creation process 48 may include other steps not shown in FIG. 4. Additionally, the steps illustrated may be performed concurrently or in a different order. Further, as will be appreciated, Tables 1-6 are provided below to showcase the value of data stored in certain locations of the PIM device 24 as the histogram creation process 48 is executed.

Beginning at block 50, the PIM device 24 may receive a command from the memory processor 26 to begin the histogram creation process 48. In some embodiments, the memory processor 26 may send the command in response to an input provided to the system 10 via the input device 14 while in other embodiments, the memory processor 26 may send the command in response to a request from a software program executed by the processor 12. The command may include information regarding the location of the data set used to create the histogram, such as whether the data is stored in the memory array 34, the system memory 20, a memory device external to the system 10, and the like. In certain embodiments, the PIM device 24 may create a histogram of streaming data. For example, the PIM device 24 may create a histogram of data captured in real-time, as opposed to retrieving a completed data set from a memory array 34 of the PIM device 24.

The command may also include information regarding the number and types of categories that will be included in the histogram. The number and types of categories may be determined according to a software program executed by the processor 12 that requests the histogram, an input provided via the input device 14, or both. Further, the command may include a mapping configuration that maps an identification number and a location in the memory array 34 to each of the categories, which may be specified by either the processor 12 or the memory processor 26. In other embodiments, the PIM device 24 may determine a mapping configuration based on its knowledge of the data stored in the memory array 34 and the number and types of categories that will be included in the histogram. Table 1, which is shown below, details an example of the mapping configuration that the PIM device 24 may use to create a histogram representing the numerical values of a data set.

TABLE 1

An example of a mapping configuration.

| Category Number | Category Type | Identification Number | Memory Location |
| --- | --- | --- | --- |
| 1 | $0 \leq x < 1$ | 00000000 | Rows 1-8, Col 1 |
| 2 | $1 \leq x < 2$ | 00000001 | Rows 1-8, Col 2 |
| 3 | $2 \leq x < 3$ | 00000010 | Rows 1-8, Col 3 |
| 4 | $3 \leq x < 4$ | 00000011 | Rows 1-8, Col 4 |

The command may also include the batch size; as will be described in further detail below, the PIM device 24 may analyze the data set in batches, and the batch size may determine the level of precision of the resulting histogram. Similarly to the number and types of categories, the batch size may be determined according to a software program executed by the processor 12 that requests the histogram or an input provided via the input device 14.

Although block 50 is described as the PIM device receiving a single command that may include an instruction to begin the histogram creation process 48, the location of the data set, the number and types of categories, the mapping configuration, and the batch size, it should be appreciated that in other embodiments, such information may be split among several commands or instructions, and may all be received by the PIM device at block 50. Further, in certain embodiments, some of the information may be received prior to approximating the histogram of each batch. Further, it should also be appreciated that in other embodiments, another processor, such as the memory processor 26, may execute the command(s) of the histogram creation process 48 and that the PIM device 24 may be used purely to compute various calculations as directed by the other processor. For instance, in embodiments such as the one depicted in FIG. 3, in which the sense amplifiers 36 and the accumulators 40 may be directly coupled to each column of the memory array 34, the memory processor 26 may execute the command(s) of the histogram creation process 48.

At block 52, the PIM device 24 may clear the memory locations mapped (e.g., assigned) to the categories at block 50. That is, the PIM device 24 may erase data stored in the memory cells assigned to the categories, such that the value of the data contained in the memory cells is "0." For example, the memory locations in Table 1 are all located within a single row, such that the PIM device 24 may clear the entire row in the memory array 34 to clear the memory locations. Table 2, which is shown below, illustrates the values of the data in the memory locations after the row is cleared. Similarly, at block 54, the PIM device 24 may clear the sense amplifiers 36 and the accumulators 40.

TABLE 2

The memory locations after the row has been cleared.

| | Column 1 | Column 2 | Column 3 | Column 4 |
|---|---|---|---|---|
| Row 1 | 00000000 | 00000000 | 00000000 | 00000000 |

At block 56, the PIM device 24 may receive or read the first batch of data from the data set. In keeping with the earlier example, the first batch of data may be {1, 3, 0, 3}. Then the PIM device 24 may approximate a histogram of the first batch of data. At block 58, the PIM device 24 may determine the category of a data point, for example by operating the memory array or a separate processor to compare the input data to a plurality of category boundaries. Following the previous example, the PIM device 24 may evaluate the first data point, "1," and determine that it belongs to category 2.

At block 60, the PIM device 24 sets the value of a flag, here a bit, representing the category in the sense amplifier 36. As used herein, a setting or clearing a "flag" refers to setting or clearing one or more bits in a component, such as the sense amplifier 36 (or other storage elements) and the accumulator 40 (or other compute components). For example, the PIM device 24 may write a word of data containing a "1" bit in the correct position into one or more of the sense amplifiers. In other embodiments, the PIM device may set the corresponding bit of the accumulator 40. Table 3 illustrates the new values in the sense amplifier 36 and the accumulator 40. In the present example, each sense amplifier 36 and accumulator 40 refers to a group of 8-bit sense amplifiers and accumulators.

TABLE 3

The values in the sense amplifier and the accumulator.

| Sense Amplifier | Accumulator |
|---|---|
| 01000000 | 00000000 |

As will be appreciated, the sense amplifier 36 and the accumulator 40 may store a data value that has a length of one or more bits. For instance, in the current example, the sense amplifier 36 and the accumulator 40 can store data that has a maximum length of one byte. Each bit in the stored data in the sense amplifier 36 and the accumulator 40 may correspond to one category, which may be identified by the identification number mentioned above. For example, in the current example, each of the 8 bits of the sense amplifier 36 and the accumulator 40 may represent a category, with the identification number of the category indicating the position of the bit from the left. Although the histogram creation process 48 is described as using the sense amplifier 36 and the accumulator 40, it should be appreciated that in other embodiments, other hardware elements that temporarily store data (e.g., registers, buffers, latches, etc.) may be used in conjunction with or in lieu of the sense amplifier 36 and/or the accumulator 40. For instance, rather than utilizing the sense amplifier 36 to store bit values representative of the category corresponding to each data point, other storage elements in lieu of the sense amplifier 36, such as registers, buffers, latches, etc. may be used to store the bit values. As used herein, "storage element" refers to any component of the PIM 24 that may be used to temporarily store a data value.

At block 62, the PIM device 24 performs a bit-wise OR operation using the values in the sense amplifier 36 and the accumulator 40 as operands and saves the results in the accumulator 40. Equation 1 and Table 4 below illustrate the results of the OR operation and the new values in the sense amplifier 36 and the accumulator 40, respectively.

$$01000000 \text{ OR } 00000000 = 01000000 \tag{1}$$

TABLE 4

The values in the sense amplifier and the accumulator.

| Sense Amplifier | Accumulator |
|---|---|
| 01000000 | 01000000 |

At block 64, the PIM device 24 determines whether the data point is the last data point of the current batch. If not, then the PIM device 24 returns to block 56 to determine the category of the next data point. Following the previous example, the values of the accumulator 40 after the next two data points, "3" and "0," are shown below in Table 5.

TABLE 5

The accumulator after the second and third data points.

| | Accumulator |
|---|---|
| After "3" | 01010000 |
| After "0" | 11010000 |

Following the current example, the PIM device 24 then encounters its first repeated value in the batch, "3." As noted above, the value currently stored in the accumulator 40 is "11010000." The PIM device 24 then sets the sense amplifier 36 based on the identification number, yielding the result "00010000." The PIM device 24 then performs a bit-wise OR operation using the values in the sense amplifier 36 and the accumulator 40 as operands and saves the results in the accumulator 40. Equation 2, which is shown below, illustrates the results of the OR operation.

$$00010000 \text{ OR } 11010000 = 11010000 \tag{2}$$

As seen above, the result is identical to the value previously stored in the accumulator 40—the bit representing category 4, into which "3" falls, still indicates the presence of a data point belonging to the category. Using such a histogram creation process 48, the PIM device 24 will "count" the first data point for each category in a batch, but not any subsequent data points in the batch that fall into the same category. Each category that has a data point appearing in the batch will have a "1" in the corresponding bit in the accumulator 40, but any category that does not will have a value of zero in the corresponding bit in the accumulator 40. For instance, in the current example, the value of the accumulator 40 is "11010000," indicating that data points in categories 1, 2, and 4 were in the batch, while none of the data points fell within category 3.

As will be appreciated, while a bit-wise OR operation has been described herein with respect to block 62 of the process 48, a bit-wise AND operation could be utilized. In this instance, the counters 42 (e.g., sets of rows and/or columns in the memory array) corresponding to the accumulator bits that are not set may be incremented. Alternatively, the counters 42 corresponding to the accumulator bits that are set may be incremented and the resulting values may be adjusted accordingly. As will be appreciated, while the present example describes incrementing by 1, values being incremented, such as in the counters 42, may be incremented by values greater than 1.

According to these steps of the histogram creation process 48, the data points may be "undercounted," which allows the PIM device 24 to approximate the histogram of each batch. However, as noted above, the batch size may be determined according to a software program executed by the processor 12 that requests the histogram or an input provided via the input device 14. Thus, the extent to which the PIM device 24 "undercounts" and therefore approximates the histogram is dependent on the size of each batch. For example, to have 100% precision, and no undercounting, the batch size is set to 1. As such, the precision of the histogram created by the histogram creation process 48 is variable and dependent on the batch size.

Alternatively, to reduce or eliminate undercounting, the presently described histogram creation process 48 may be used in combination with counters 42. For instance, the accumulators 40 and sense amplifiers 36 may be used in conjunction with memory locations in the memory array to count data points in a category in situations where no more than one data point appears in each category. However, to avoid or reduce undercounts, in situations where more than one data point is received in a particular category and more precision is desired, the counters 42 may be employed to track the data points with multiple occurrences in a single category. Thus, the counters 42 may be used in a more limited manner, in combination with the histogram creation process 48.

Returning back to FIG. 4, if the PIM device 24 determines, at block 64, that the current data point is the last data point in the batch, then the PIM device 24 may proceed to block 66. At block 66, the PIM device 24 increments the values in the memory locations based on the value of the bits in the accumulator 40. In particular, for each category, the PIM device 24 will increment by one the data value stored in the corresponding memory location if the corresponding bit in the accumulator 40 is set. Accordingly, the memory locations may be used as de-facto counters, in lieu of or in conjunction with the counters 42, and may be incremented based on the approximated histogram of each batch of data.

Once the PIM device 24 updates the memory locations, at block 68 it determines whether the current batch is the last batch of the data set. If not, then the PIM device 24 returns to block 54 to clear the sense amplifier 36 and the accumulator 40 in preparation for the next batch of data. If so, then the PIM device 24 generates the histogram of the data set based on the values of in the memory locations at block 70.

Using the sense amplifier 36 and the accumulator 40, which are located in close proximity to the memory array 34, utilizes less computing time than incrementing a dedicated counter 42. As such, by reducing the number of times a dedicated counter 42 is incremented, or in certain embodiments, foregoing the use of the dedicated counter 42, the computing time is decreased. For example, rather than incrementing the counters 42 for each data point, the PIM device 24 might only increment the values in the memory locations (i.e., writing a new value to the memory location) after each batch, which reduces computing time, especially as the batch size increases. Further, within each batch, dedicated counters 42 and memory locations used as counters need not be used at all; instead, the PIM device 24 can use the sense amplifier 36 and the accumulator 40 to "count," which also reduces the computing time. Additionally, in embodiments of the PIM device 24 that contain multiple sense amplifiers 36 and accumulators 40, the PIM device 24 may analyze batches in parallel, further reducing the computing time of the histogram creation process 48. For instance, in embodiments such as the one depicted in FIG. 3, batches may be assigned to sets of columns in the memory array 34 and the associated sense amplifiers 36 and accumulators 40; the batches may then be analyzed in parallel, thereby reducing the computing time of the histogram creation process 48.

In some embodiments, the processor 12, memory processor 26 or elements of the PIM device 24 may be operably coupled to one or more storage devices (e.g., system memory 20) to execute instructions for carrying out the presently disclosed techniques. For example, these instructions may be encoded in programs that are stored, which may be an example of a tangible, non-transitory computer-readable medium, and may be accessed and executed by the processor to allow for the presently disclosed techniques to be performed. Additionally and/or alternatively, the instructions may be stored in an additional suitable article of manufacturer that includes at least one tangible, non-transitory computer-readable medium that at least collectively stores these instructions or routines. For example the article of manufacturer, which includes at least one tangible, non-transitory computer-readable medium, and/or the storage may include, for example, random-access memory, read-only memory, rewritable memory, flash memory, and/or other physical storage devices, such as a hard drive and/or optical discs.

Figure 5:
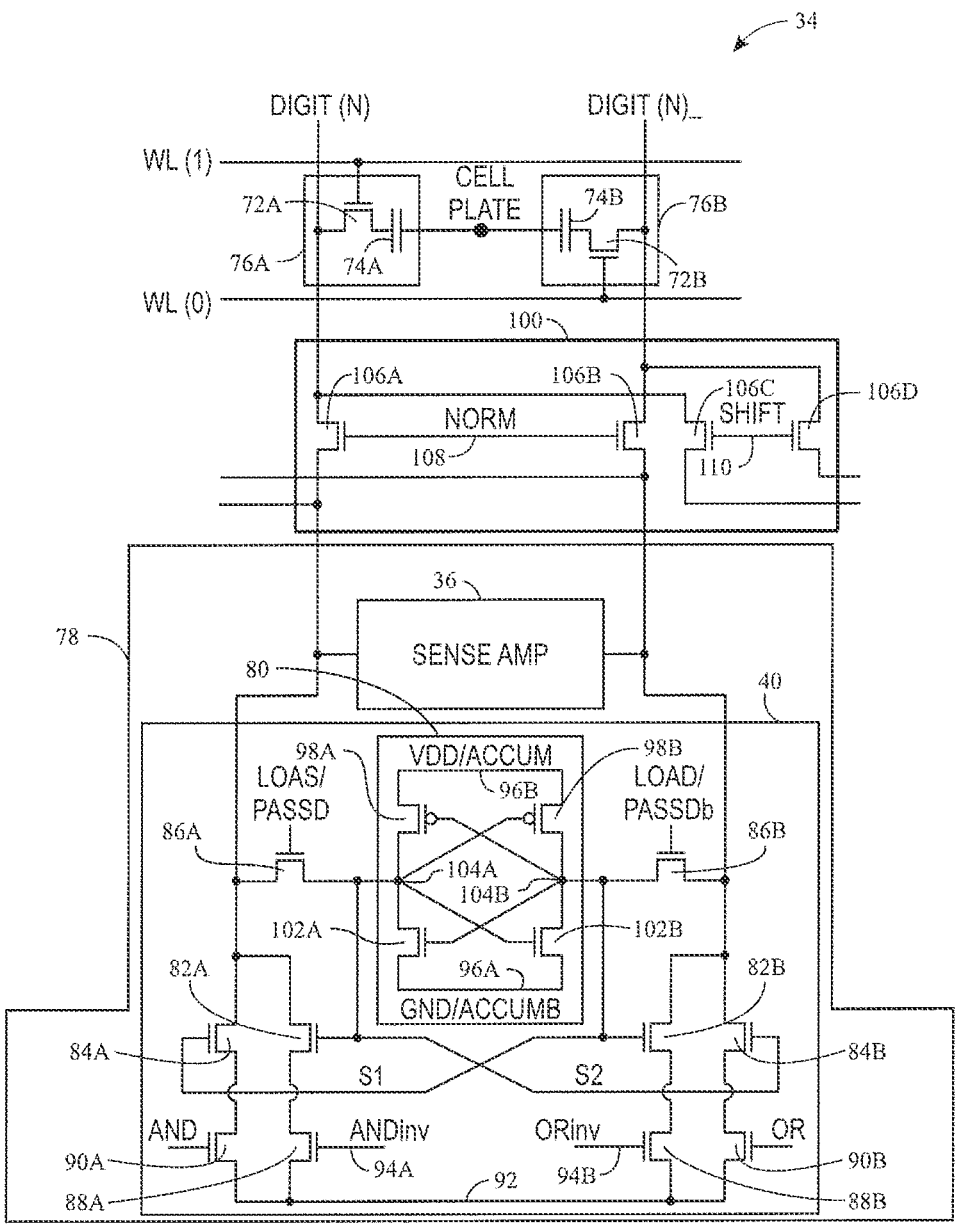
FIG. 5 is a schematic diagram of a portion of the processor-in-memory device of FIG. 2, illustrating a memory array coupled to sensing circuitry, in accordance with an embodiment of the present approach.

FIG. 5 illustrates a schematic diagram of a portion of a memory array 34 in accordance with an embodiment of the present disclosure. In the illustrated portion of the memory array 34, a memory cells 72A and 72B (collectively, memory cells 72), each including a storage element, such as a capacitor 74A and 74B (collectively, capacitors 74), and an access device, such as a transistor 76A and 76B (collectively, transistors 76), is provided. In this example, the memory array 34 is a DRAM array of 1T1C (one transistor one capacitor) memory cells. As will be appreciated, other types of memory arrays 34 may be utilized. In one embodiment, the memory cells 72 may be destructive read memory cells (e.g., reading the data stored in the cell destroys the data such that the data originally stored in the cell is refreshed after being read). The memory cells 72 of the memory array 34 are arranged in rows coupled by word lines, such as word lines WL(0), WL(1), and columns coupled by pairs of complementary data lines, such as data lines DIGIT(n) and DIGIT(n)_. The pair of complementarity data lines DIGIT (n) and DIGIT(n)_ can be referred to as a column. For instance, referring to a column can refer to complementary sense lines such as DIGIT(n) and DIGIT(n)_ being included when referring to a "column." Although only a pair of memory cells 72 and a pair of complementary data lines DIGIT(n) and DIGIT(n)_ are shown in FIG. 5 (e.g., one "column"), embodiments of the present disclosure are not so limited, and an array of memory cells can include additional columns of memory cells and/or data lines (e.g., 4,096, 8,192, 16,384, etc.).

Memory cells 72 can be coupled to different data lines and/or word lines. For example, a first source/drain region of a transistor 76A can be coupled to data line DIGIT(n), a second source/drain region of transistor 76A can be coupled to capacitor 74A, and a gate of a transistor 76A can be coupled to word line WL(1). A first source/drain region of a transistor 76B can be coupled to data line DIGIT(n)_, a second source/drain region of transistor 76B can be coupled to capacitor 74B, and a gate of a transistor 76B can be coupled to word line WL(0). The cell plate, as shown in FIG. 5, can be coupled to each of capacitors 74A and 74B. The cell plate can be a common node to which a reference voltage (e.g., ground) can be applied in various memory array configurations.

The memory array 34 is coupled to sensing circuitry 78. As will be appreciated, in accordance with one embodiment, the PIM device 24 may include one sensing circuitry 78 for each pair of complementarity data lines DIGIT(n) and DIGIT(n)_. In one embodiment, each sensing circuitry 78 includes a sense amplifier 36 and a corresponding compute component, such as an accumulator 40, corresponding to respective columns of memory cells 72 (e.g., coupled to respective pairs of complementary data lines). The sensing circuitry 78 may include a number of elements, but it at least includes a sense amp 36 and corresponding compute component, such as an accumulator 40, per column (e.g., the two complementary sense lines in reference to a column) of the memory array 34. In this example, the sense amplifier 36 may include a cross coupled latch, which can be referred to herein as a primary latch. The sense amplifier 36 can be configured, for example, as previously described.

In the example illustrated in FIG. 5, the circuitry corresponding to accumulator 40 comprises a static latch 80 and an additional number of (e.g., ten) transistors that implement, among other things, a dynamic latch. For ease of reference, the accumulator 40 has been illustrated in an expanded format to describe the functioning of the accumulator 40. The dynamic latch and/or static latch 80 of the accumulator 40 can be referred to herein as a secondary latch. The transistors of accumulator 40 can all be n-channel transistors (e.g., NMOS transistors), for example. However, embodiments are not limited to this example.

In this example, data line DIGIT(n) is coupled to a first source/drain region of transistors 82A and 84A, as well as to a first source/drain region of load/pass transistor 86A. Data line DIGIT(n)_ is coupled to a first source/drain region of transistors 82B and 84B, as well as to a first source/drain region of load/pass transistor 86B. The gates of load/pass transistor 86A and 86B are commonly coupled to a LOAD control signal, or respectively coupled to a PASSD/PASSDB control signal, as discussed further below. A second source/drain region of load/pass transistor 86A is directly coupled to the gates of transistors 82A and 84A. A second source/drain region of load/pass transistor 86B is directly coupled to the gates of transistors 82B and 84B.

A second source/drain region of transistor 82A is directly coupled to a first source/drain region of pull-down transistor 88A. A second source/drain region of transistor 84A is directly coupled to a first source/drain region of pull-down transistor 90A. A second source/drain region of transistor 82B is directly coupled to a first source/drain region of pull-down transistor 88B. A second source/drain region of transistor 84B is directly coupled to a first source/drain region of pull-down transistor 90B. A second source/drain region of each of pull-down transistors 90A, 90B, 88A, and 88B is commonly coupled together to a reference voltage (e.g., ground (GND) 92). A gate of pull-down transistor 90A is coupled to an AND control signal line, a gate of pull-down transistor 88A is coupled to an ANDinv control signal line 94A, a gate of pull-down transistor 88B is coupled to an ORinv control signal line 94B, and a gate of pull-down transistor 90B is coupled to an OR control signal line.

The gate of transistor 84A can be referred to as node S1, and the gate of transistor 84B can be referred to as node S2. The circuit shown in FIG. 5 stores accumulator data dynamically on nodes S1 and S2. Activating a LOAD control signal causes load/pass transistors 86A and 86B to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 5 is not contingent on the LOAD control signal being elevated to a voltage greater than $V_{DD}$.

The configuration of the accumulator 40 shown in FIG. 5 has the benefit of balancing the sense amplifier 36 for functionality when the pull-down transistors 90A, 90B, 88A, and 88B are conducting before the sense amplifier 36 is fired (e.g., during pre-seeding of the sense amplifier 36). As used herein, firing the sense amplifier 36 refers to enabling the sense amplifier 36 to set the primary latch and subsequently disabling the sense amplifier 36 to retain the set primary latch. Performing logical operations after equilibration is disabled (in the sense amplifier 36), but before the sense amplifier 36 fires, can save power usage because the latch of the sense amplifier 36 does not have to be "flipped" using full rail voltages (e.g., $V_{DD}$, GND).

Inverting transistors can pull-down a respective data line in performing certain logical operations. For example, transistor 82A (having a gate coupled to S2 of the dynamic latch) in series with transistor 88A (having a gate coupled to an ANDinv control signal line 94A) can be operated to pull-down data line DIGIT(n), and transistor 82B (having a gate coupled to S1 of the dynamic latch) in series with transistor 88B (having a gate coupled to an ORinv control signal line 94B) can be operated to pull-down data line DIGIT(n)_.

The latch 80 can be controllably enabled by coupling to an active negative control signal line 96A (ACCUMB) and an active positive control signal line 96B (ACCUM) rather than be configured to be continuously enabled by coupling to ground and $V_{DD}$. In various embodiments, load/pass transistors 98A and 98B can each have a gate coupled to one of a LOAD control signal or a PASSD/PASSDB control signal.

According to some embodiments, the gates of load/pass transistors 86A and 86B can be commonly coupled to a LOAD control signal. In the configuration where the gates of load/pass transistors 86A and 86B are commonly coupled to the LOAD control signal, transistors 86A and 86B can be load transistors.

According to some embodiments, the gate of load/pass transistors 86A can be coupled to a PASSD control signal, and the gate of load/pass transistor 86B can be coupled to a PASSDB control signal. In the configuration where the gates of transistors 86A and 86B are respectively coupled to one of the PASSD and PASSDB control signals, transistors 86A and 86B can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator 40 (e.g., through the adjacent accumulator 40 and respective shift circuitry 100 in memory array 34, as shown in FIG. 5). According to some embodiments, load/pass transistors 86A and 86B can be configured to accommodate the heavier loading corresponding to a pass transistor but be coupled and operated as a load transistor. For example, load/pass transistors 86A and 86B configured as pass transistors can also be utilized as load transistors. However, load/pass transistors 86A and 86B configured as load transistors may not be capable of being utilized as pass transistors.

In a number of embodiments, the accumulator 40 (including the latch 80) can include a number of transistors formed on pitch with the transistors of the corresponding memory cells 72 of a memory array (e.g., memory array 34 shown in FIG. 5) to which they are coupled, which may conform to a particular feature size (e.g., $4F^2$, $6F^2$, etc.). According to various embodiments, latch 80 can include four transistors 98A, 98B, 102A, and 102B coupled to a pair of complementary data lines DIGIT(n) and DIGIT(n)_through load/pass transistors 86A and 86B. However, embodiments are not limited to this configuration. The latch 80 can be a cross coupled latch. For instance, the gates of a pair of transistors, such as n-channel transistors (e.g., NMOS transistors) 102A and 102B are cross-coupled with the gates of another pair of transistors, such as p-channel transistors (e.g., PMOS transistors) 98A and 98B. As described further herein, the cross-coupled latch 80 can be referred to as a static latch.

The voltages or currents on the respective data lines DIGIT(n) and DIGIT(n)_ can be provided to the respective latch inputs 104A and 104B of the cross coupled latch 80 (e.g., the input of the secondary latch). In this example, the latch input 104A is coupled to a first source/drain region of transistors 98A and 102A as well as to the gates of transistors 98B and 102B. Similarly, the latch input 104B can be coupled to a first source/drain region of transistors 98B and 102B as well as to the gates of transistors 98A and 102A.

In this example, a second source/drain region of transistor 102A and 102B is commonly coupled to a negative control signal line 96A (e.g., ground (GND) or ACCUMB control signal). A second source/drain region of transistors 98A and 98B is commonly coupled to a positive control signal line 96B (e.g., $V_{DD}$ or ACCUM control signal). The positive control signal 96B can provide a supply voltage (e.g., $V_{DD}$) and the negative control signal 96A can be a reference voltage (e.g., ground) to enable the cross coupled latch 80. According to some embodiments, the second source/drain region of transistors 98A and 98B are commonly coupled directly to the supply voltage (e.g., $V_{DD}$), and the second source/drain region of transistor 102A and 102B are commonly coupled directly to the reference voltage (e.g., ground) so as to continuously enable latch 80.

The enabled cross coupled latch 80 operates to amplify a differential voltage between latch input 104A (e.g., first common node) and latch input 104B (e.g., second common node) such that latch input 104A is driven to either the activated positive control signal voltage (e.g., $V_{DD}$) or the activated negative control signal voltage (e.g., ground), and latch input 104B is driven to the other of the activated positive control signal voltage (e.g., $V_{DD}$) or the activated negative control signal voltage (e.g., ground).

As shown in FIG. 5, the sense amplifier 36 and the accumulator 40 can be coupled to the array 34 via shift circuitry 100. In some examples, the sensing circuitry 78 can include shifting circuitry for each data line pair DIGIT(n)_ and DIGIT(n)_, such as shifting circuitry 100, as shown in FIG. 5. In this example, the shift circuitry 100 comprises a pair of isolation devices coupled to respective data lines of a complementary data line pair (e.g., isolation transistors 106A and 106B of shifting circuitry 100 are coupled to data lines DIGIT(n) and DIGIT(n)_, respectively). In this example, the isolation transistors (e.g., 106A and 106B) are coupled to a control signal 108 (NORM) that, when activated, enables (e.g., turns on) the isolation transistors 106A and 106B to couple the corresponding sense amplifier 36 and accumulator 40 to a corresponding column of memory cells (e.g., to a corresponding pair of complementary data lines DIGIT(n) and DIGIT(n)_ and the accumulator 40 corresponding to each of the adjacent data lines (not shown)). According to various embodiments, conduction of the isolation transistors (e.g., 106A and 106B) can be referred to as a "normal" configuration of the shift circuitry 100.

In the example illustrated in FIG. 5, the shift circuitry 100 includes another (e.g., a second) pair of isolation devices coupled to a complementary control signal (e.g., shift circuitry 100 includes isolation transistors 106C and 106D coupled to complementary control signal 110 (SHIFT)), which can be activated, for example, when NORM 108 is deactivated. The isolation transistors (e.g., 106C and 106D) can be operated (e.g., via control signal 110) such that a particular sense amplifier 36 and accumulator 40 are coupled to a different pair of complementary data lines (e.g., a pair of complementary data lines different than the pair of complementary data lines to which isolation transistors 106A and 106B couple the particular sense amplifier 36 and accumulator 40), or can couple a particular sense amplifier 36 and accumulator 40 to another memory array (and isolate the particular sense amplifier 36 and accumulator 40 from a first memory array). According to various embodiments, the shift circuitry 100 can be arranged as a portion of (e.g., within) a corresponding sense amplifier 36, for instance.

Although the shift circuitry 100 shown in FIG. 5 includes isolation transistors 106A and 106B used to couple a particular sensing circuitry 78, (e.g., a particular sense amplifier 36 and corresponding accumulator 40) to a particular pair of complementary data lines (e.g., DIGIT(n) and DIGIT(n)_) and isolation transistors 106C and 106D are arranged to couple the particular sensing circuitry 78 to an adjacent pair of complementary data lines in one particular direction (e.g., adjacent data lines), embodiments of the present disclosure are not so limited. For instance, shift circuitry 100 can include isolation transistors (e.g., 106A and 106B) used to couple particular sensing circuitry to a particular pair of complementary data lines (e.g., DIGIT(n) and DIGIT(n)_) and isolation transistors (e.g., 106C and 106D) arranged so as to be used to couple a particular sensing circuitry 78 to an adjacent pair of complementary data lines in another particular direction.

Embodiments of the present disclosure are not limited to the configuration of shift circuitry shown in FIG. 5. For instance, determining whether to shift in a particular direction to perform a shift operation is independent of the circuitry implementation. In other embodiments, shift circuitry such as that shown in FIG. 5 (e.g., shift circuitry 100) can be operated (e.g., in conjunction with corresponding sensing circuitry 78) in association with performing mathematical operations such as adding and subtracting operations without transferring data out of the sensing circuitry via an I/O line (e.g., local I/O line (IO/IO_)), for instance.

Although not shown in FIG. 5, each column of memory cells can be coupled to a column decode line that can be activated to transfer, via a local I/O line, a data value from a corresponding sense amplifier 36 and/or compute component, such as an accumulator 40, to a control component external to the array such as an external processing resource (e.g., host processor 12 and/or other functional unit circuitry). The column decode line can be coupled to a column decoder. However, as described herein, in a number of embodiments, data need not be transferred via such I/O lines to perform logical operations in accordance with embodiments of the present disclosure. In other embodiments, shift circuitry 100 can be operated in conjunction with sense amplifiers 36 and compute components, such as accumulators 40, to perform logical operations without transferring data to a control component external to the memory array 24, or PIM 24, for instance.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A processor-in-memory device, comprising:
a memory array;
an accumulator coupled to the memory array; and
a sense amplifier, wherein the sense amplifier is coupled to the accumulator and the memory array; and
wherein the processor-in-memory device is configured to:
receive a data set comprising a plurality of data batches, wherein each data batch comprises a plurality of data points;
determine to which category of a plurality of categories each data point in a first data batch of the plurality of data batches belongs;
set a value of a flag bit, in the sense amplifier, wherein the flag bit corresponds, in a bit position, to the category of the plurality of categories to which a data point in the first data batch of data is determined to belong;
after having set a value of each of a first subset of a set of flag bits in the sense amplifier, each flag bit of the first subset respectively corresponding, in bit position, to a category of data determined to be present in the first data batch of the plurality of data batches, increment a value stored in the accumulator;
modify one or more values stored in the memory array using the incremented value stored in the accumulator; and
generate a histogram of the first data batch using the one or more values stored in the memory array.

2. The processor-in-memory device of claim 1, wherein the processor-in-memory device is configured to generate the histogram of the first data batch of the data set using the incremented value based on whether or not a corresponding respective flag bit stored in the sense amplifier was set as part of the first subset such that a first data point determined to belong to a first category of the plurality of categories in the first data batch is counted but not any subsequent data points in the first data batch that are determined to be in the first category.

3. The processor-in-memory device of claim 1, wherein the processor-in-memory device is configured to increment the value stored in the accumulator by performing a bit-wise OR operation using the value set in the sense amplifier and the value stored in the accumulator.

4. The processor-in-memory device of claim 1, wherein the processor-in-memory is configured to increment the value stored in the sense amplifier in parallel.

5. The processor-in-memory device of claim 1, wherein the processor-in-memory device is configured to receive a mapping configuration assigning an identification number and one of a plurality of memory locations in the memory array to each of the plurality of categories.

6. The processor-in-memory device of claim 1, wherein the processor-in-memory device is configured to generate the histogram by:
clearing data stored in the memory array;
for each data point in the first data batch:
performing a bit-wise OR operation using values in the sense amplifier and values in the accumulator as operands; and
saving a result of the bit-wise OR operation in the accumulator.

7. The processor-in-memory device of claim 1, wherein the sense amplifier stores a plurality of bits.

8. The processor-in-memory device of claim 1, wherein the memory array is a dynamic random access memory array.

9. A system, comprising:
a processor;
an accumulator coupled to the processor;
a sense amplifier coupled to the accumulator and the processor; and
wherein the processor is configured to:
receive a data set comprising a plurality of data batches, wherein each data batch comprises a plurality of data points;
determine to which category of a plurality of categories each data point in a first data batch of the plurality of data batches belongs;
set a value of a flag bit, in the sense amplifier, wherein the flag bit corresponds, in a bit position, to the category of the plurality of categories to which a data point in the first data batch of data is determined to belong;
after having set a value of each of a first subset of a set of flag bits in the sense amplifier, each flag bit of the first subset respectively corresponding, in bit position, to a category of data determined to be present in the first data batch of the plurality of data batches, increment the value stored in the accumulator; and
generate a histogram of the first data batch using the incremented value.

10. The system of claim 9, wherein the processor is a processor of a processor-in-memory device.

11. The system of claim 10, wherein the processor-in-memory device is configured to:
incrementat least one value in a memory location of the processor-in-memory device, corresponding to the set flag bits of the first data batch, and determine if the first data batch of data is the last data batch of the data set.

12. The system of claim 9, wherein the processor is configured to increment the value stored in the accumulator by performing a bit-wise OR operation using the value set in the sense amplifier and the value stored in the accumulator.

13. The system of claim 9, wherein the processor is configured to receive a mapping configuration assigning an identification number and one of a plurality of memory locations in a memory array to each of the plurality of categories.

14. The system of claim 9, wherein the processor is configured to generate the histogram of the first data batch of the data set using the incremented value based on whether or not a corresponding respective flag bit stored in the sense amplifier was set as part of the first subset such that a first data point determined to belong to a first category of the plurality of categories in the first data batch is counted but not any subsequent data points in the first data batch that are determined to be in the first category.

15. The system of claim 9, wherein the processor is configured to clear data in the accumulator prior to determining to which category of the plurality of categories each data point in the first data batch of the plurality of data batches belongs.

16. The system of claim 9, wherein the processor is configured to read the data set from a memory array coupled to the processor before determining to which category of the plurality of categories each data point in the first data batch of the plurality of data batches belongs.

17. The system of claim 9, wherein the sense amplifier is coupled between the accumulator and a memory array.

18. A system, comprising:
a host processor; and
a processor-in-memory device coupled to the host processor, wherein the processor-in-memory device comprises:
a memory array including a plurality of memory locations, wherein each of the memory locations stores a value;
an accumulator coupled to a first group of the plurality of memory locations;
a sense amplifier storing a plurality of bits, wherein the sense amplifier is coupled to the accumulator and the memory array; and
wherein the processor-in-memory device is configured to:
receive a data set comprising a plurality of data batches, wherein each data batch comprises a plurality of data points;
determine to which category of a plurality of categories each data point in a first data batch of the plurality of data batches belongs;
set a value of a flag bit in the sense amplifier, wherein the flag bit corresponds, in a bit position, to the category of the plurality of categories to which a data point in the first data batch of data is determined to belong;
after having set a value of each of a first subset of a set of flag bits in the sense amplifier, each flag bit of the first subset respectively corresponding, in bit position, to a category of data determined to be present in the first data batch of the plurality of data batches, performing, a bit-wise OR operation using the value of the first subset of the set of flag bits stored in the sense amplifier and values in the accumulator as operands to generate a result;
modify one or more values stored in the memory array using the result; and
generate a histogram of the first data batch using the one or more values stored in the memory array.

19. The system of claim 18, wherein the host processor is configured to transmit a request to generate the histogram to the memory processor.

20. The system of claim 18, wherein the processor-in-memory device is configured to read the data set from the memory array before determining to which category of the plurality of categories each data point in the first data batch of the plurality of data batches belongs.

* * * * *